United States Patent [19]
Weinert et al.

[11] Patent Number: 5,945,888
[45] Date of Patent: Aug. 31, 1999

[54] DIELECTRIC RESONATOR TUNABLE VIA A CHANGE IN GAS PRESSURE

[75] Inventors: Robert W. Weinert, Monroeville, Pa.; Michael M. Driscoll, Ellicott City, Md.

[73] Assignee: Northrop Grumman Corporation, Los Angeles, Calif.

[21] Appl. No.: 08/874,286

[22] Filed: Jun. 9, 1997

[51] Int. Cl.⁶ .................................................. H03J 7/04
[52] U.S. Cl. .......................................... 333/17.1; 333/235
[58] Field of Search ................................. 333/219.1, 235, 333/17.1, 995

[56] References Cited

U.S. PATENT DOCUMENTS 3,525,953  8/1970  Halverson ........................... 333/231 X
5,052,183  10/1991 Koscica et al. ...................... 333/995 X

FOREIGN PATENT DOCUMENTS 4336801  11/1992  Japan ...................................... 333/17.1

OTHER PUBLICATIONS

Arams, F.R., et al; "Wide Range Electronic Tuning of Microwave Cavities"; *Proceedings of the IRE;* vol. 43, No. 9; Sep. 1995; pp. 1102–1110.

Nowogrodzki M.; "Control of Resonant Cavity Frequency by Gas Pressure"; *RCA Technical Notes;* TN 125; Mar. 1958.

Morris E.C. et al; "Microwave Absorption by Gas Mixtures of at Pressures up to Several Hundred Bars"; Australian Journal of Physics; vol. 23, No. 3; 1970; pp. 335–349.

*Primary Examiner*—Benny Lee

[57] ABSTRACT

A dielectric resonator encased within a pressure enclosure establishes the operating frequency of a microwave circuit. The enclosure is supplied with a pressurized gas and the pressure within the enclosure is varied as a function of the deviation of the operating frequency from a desired value. For more precise control the enclosure is preferably immersed in a cryogenic cooling system.

8 Claims, 4 Drawing Sheets

DIELECTRIC RESONATOR TUNABLE VIA A CHANGE IN GAS PRESSURE

BACKGROUND OF THE INVENTION

1. Field of the Invention

The invention in general relates to dielectric resonators for microwave circuits, and more particularly to a dielectric resonator which can be tuned by non-mechanical means.

2. Description of related art

Dielectric resonators are often used as frequency determining elements in microwave circuits. Such dielectric resonators are of relatively small size and exhibit low noise, high efficiency, high temperature stability and reliability. Various types of dielectric resonators are used for governing the frequency in oscillator circuits for microwave systems such as radar, communication links, navigation and electronic warfare, by way of example.

The dielectric resonator, operable at a particular frequency, is tunable over a narrow bandwidth and frequency fine tuning must be accomplished without affecting the high Q of the resonator. In addition, vibrational immunity is necessary for intended low noise applications such as required for stable oscillators.

Many dielectric resonators include a dielectric member which is generally positioned within an enclosure, and frequency tuning of these resonators include changing the dimensions of the enclosure or inserting metal or dielectric rods into the enclosure. This mechanical link from the inside of the enclosure to the outside of the enclosure would objectionably increase vibrationally induced, resonator frequency instabilities.

Non-mechanical tuning includes the use of ferrites with an accompanying magnetic field which is varied, as well as utilizing photosensitive material on the dielectric member and illuminating the photosensitive material to change its conductivity and perturbate the electromagnetic field in and around the dielectric resonator.

The present invention provides for a non-mechanical tuning of a dielectric resonator, which is relatively simple and which does not affect the high Q of the resonator, particularly when the resonator is operated at cryogenic temperatures.

SUMMARY OF THE INVENTION

The dielectric resonator apparatus in accordance with the present invention includes a dielectric resonator having a sealed pressure enclosure within which is a dielectric member. A first coupling means is provided for coupling microwave power to the resonator and a second coupling means is provided for extracting microwave power, with the coupling means being connectable with a microwave circuit.

Means are provided for monitoring the operating frequency of the resonator and means are provided for varying the pressure within the enclosure to vary the operating frequency of the resonator. The pressure is varied by the introduction or removal of a gas which is supplied to the interior of the enclosure. In order to take advantage of the higher Q values obtainable at lower temperatures, the apparatus is preferably operated within a cryogenic cooler arrangement.

DESCRIPTION OF THE PREFERRED EMBODIMENT

Figure 1:
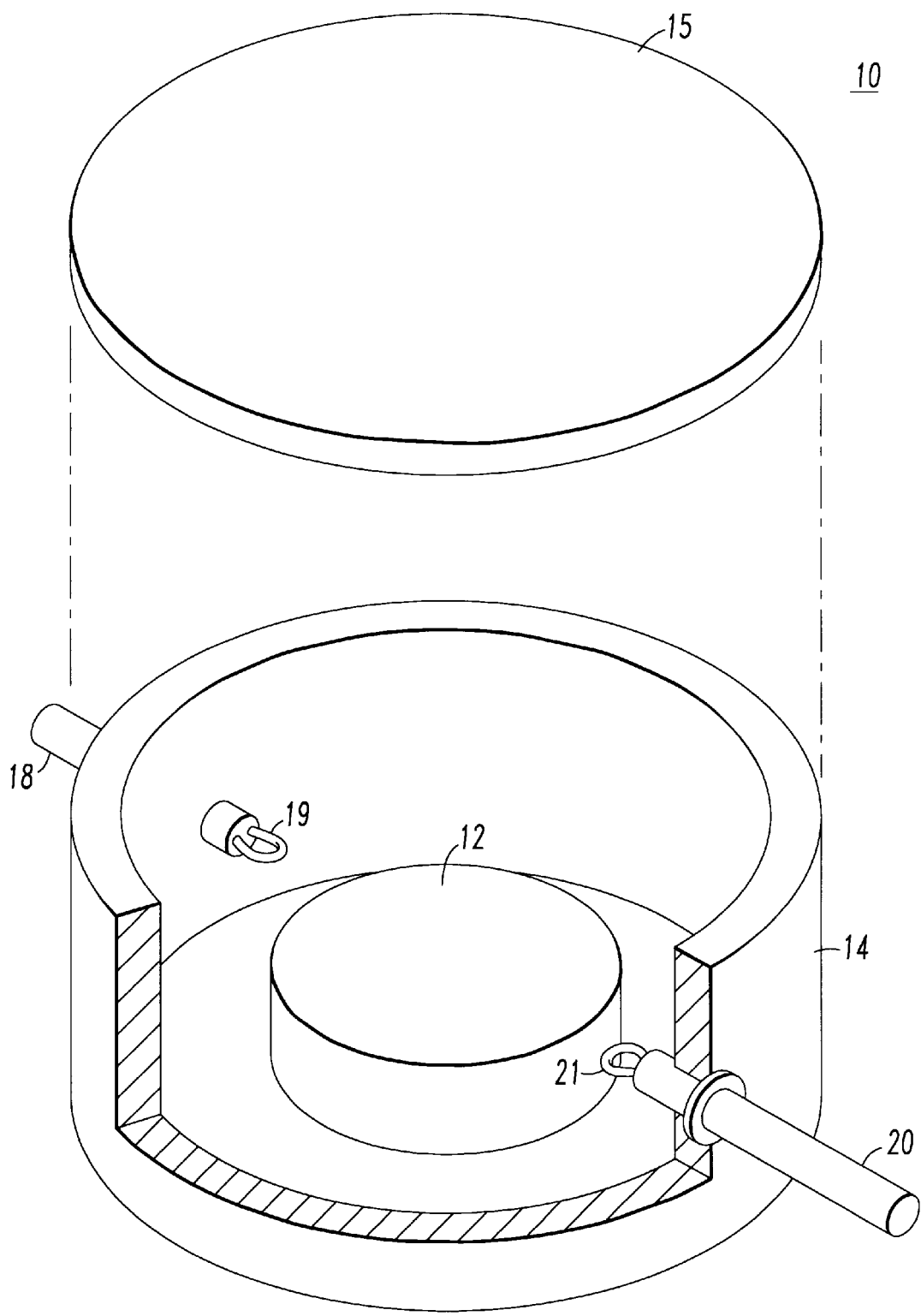
FIG. 1 is an exploded view, partially in section, of a dielectric resonator used herein.

In the drawings, which are not necessarily to scale, like or corresponding parts are denoted by like or corresponding reference numerals.

In FIG. 1 dielectric resonator 10 includes a dielectric member 12 in the form of a short cylinder, or disk, and of a dielectric material such as sapphire. The dielectric member 12 is encased in a pressure enclosure 14, having an end cap 15 for sealing off the enclosure to the surrounding ambient medium.

A first coupling means, coaxial cable 18, with a horizontal loop termination 19, serves to couple microwave energy into the resonator 10 while a second coupling means, coaxial cable 20, with loop termination 21, serves to extract microwave energy from the resonator. The cables 18 and 20 are electrically connected to a microwave circuit, such as an oscillator (not shown), and is used as the frequency determining element of the circuit.

Figure 2A:
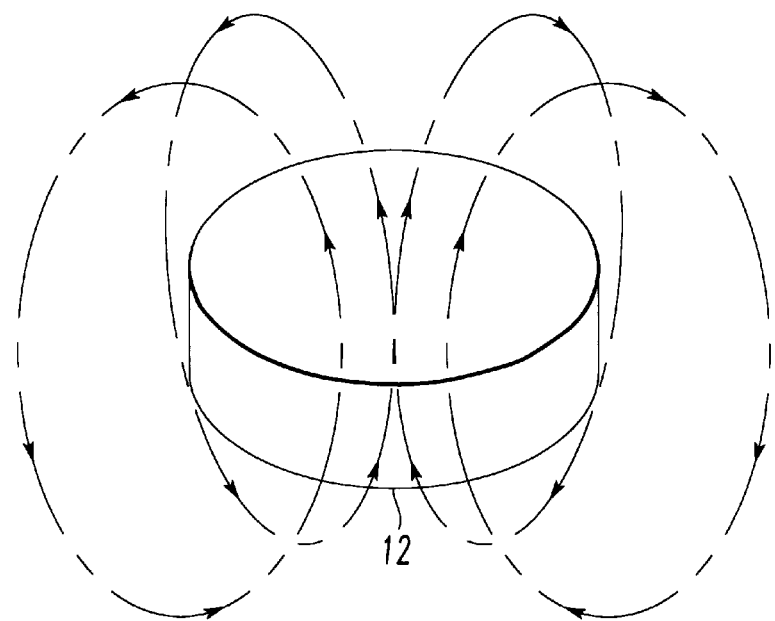
FIGS. 2A and 2B illustrate the magnetic and electric fields respectively around and in the dielectric member illustrated in FIG. 1.
Figure 2B:
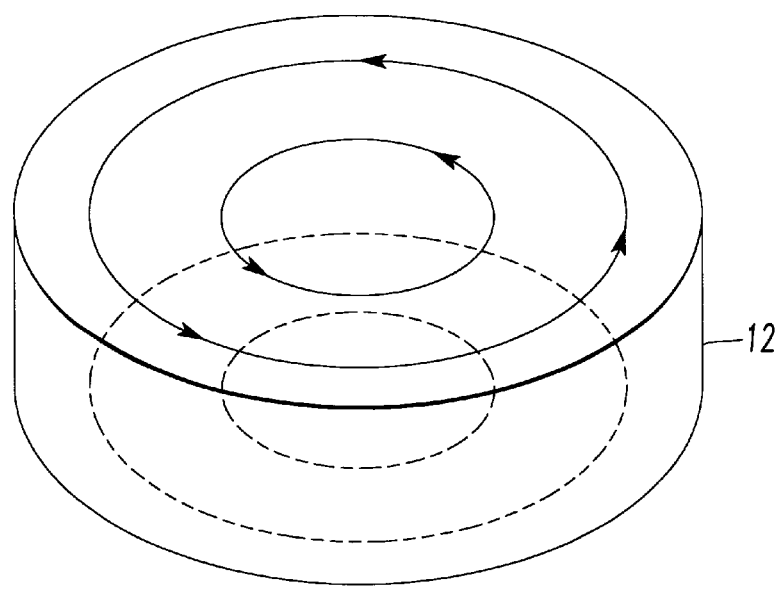

For the particular dielectric member 12 illustrated, and for the orientation of the coupling loops 19 and 21, magnetic and electric fields are established in and around the dielectric member 12, as portrayed in FIGS. 2A and 2B. FIG. 2A shows the magnetic field distribution for the well known $TE_{01\delta}$ mode and FIG. 2B shows the electric field distribution for that mode.

Figure 3:
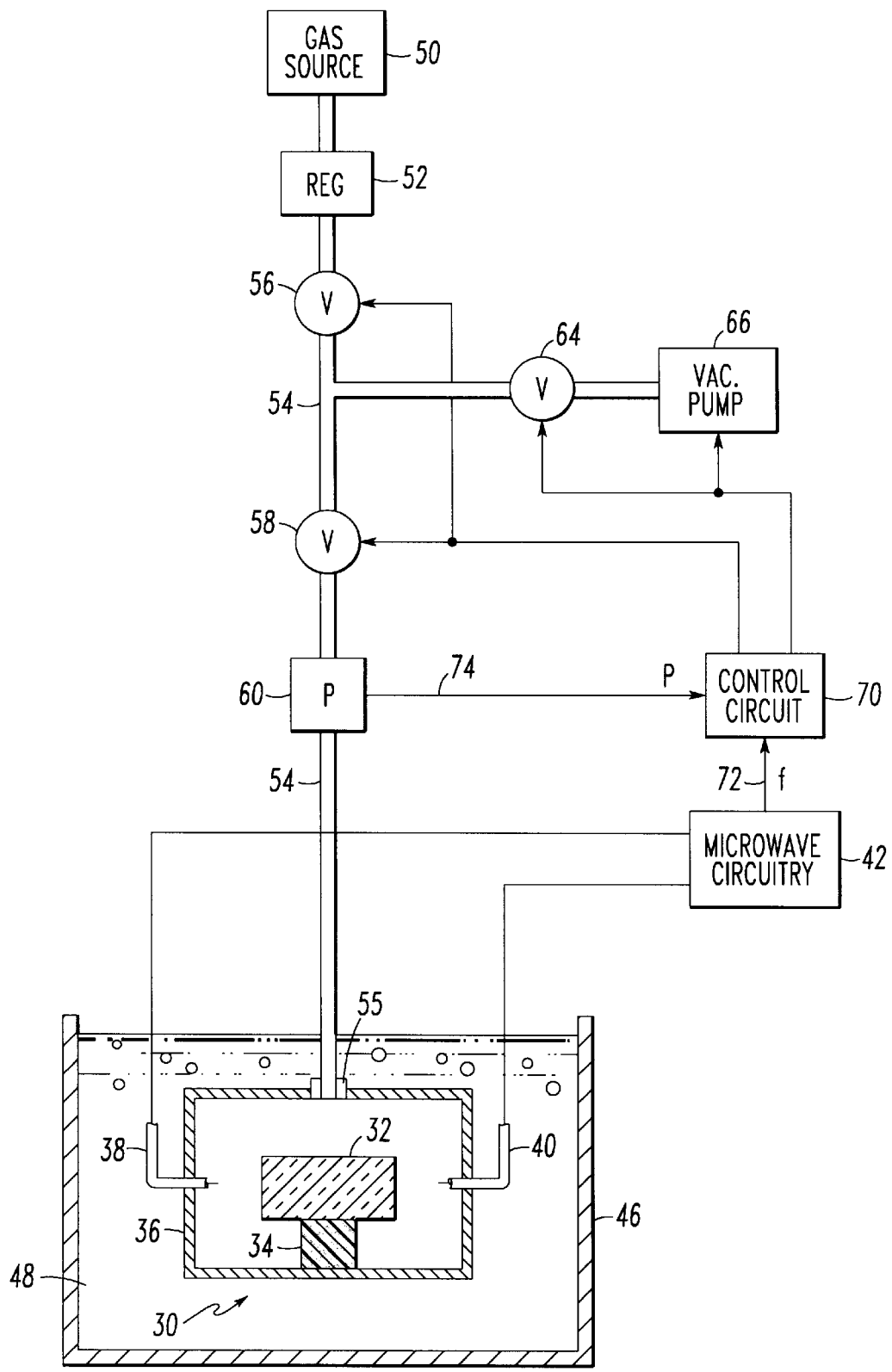
FIG. 3 is a schematic diagram illustrating one embodiment of the present invention.

FIG. 3 illustrates a dielectric resonator 30 having a dielectric member 32, similar to that described in FIG. 1, held in position on an insulator, such as styrofoam support 34. The dielectric member 32 is encased in a sealed pressure enclosure 36, from which input and output coaxial cables 38 and 40 lead to external microwave circuitry 42, such as an oscillator.

The Q factor is a figure of merit for a resonant circuit which basically relates its capacity for electromagnetic energy storage with its energy dissipation through heat. Resonator bandwidth is inversely proportional to Q; that is, the higher the Q value for a resonant circuit the narrower will be its bandwidth. If operated at extremely low temperatures in the cryogenic region of about 100 K or below, dielectric resonators exhibit a higher Q value (for example, $Q \geq 10^6$) and lower noise than do comparable room temperature dielectric resonators (for example, $Q \leq 10^5$).

Accordingly, in FIG. 3, cryogenic cooling means is provided to take advantage of improved performance at cryogenic temperatures. The cryogenic cooling apparatus, in one elementary embodiment, includes a cryogenic vessel 46 filled with a cryogenic fluid 48, such as liquid nitrogen and into which is immersed the dielectric resonator 30. For use in the field, other types of cryogenic cooling means, such as a closed cryogenic refrigerant system, may be used.

Means are provided for varying the pressure within the enclosure 36 and include a source of gas 50, the high output pressure of which is reduced by pressure regulator 52. The gas is provided to the interior of enclosure 36 via conduit 54 and gas fitting 55 when controlled valves 56 and 58 are opened. An indication of the pressure P within enclosure 36 may be obtained with the provision of pressure sensor 60.

When the pressure within enclosure 36 is to be reduced, valve 56 is closed while valves 58 and 64 are opened, and a vacuum pump 66 is activated.

It may be shown that for a particular nominal operating frequency, the dielectric resonator of FIG. 3 will exhibit a change in frequency which is proportional to both the change in pressure within the enclosure 36 and the susceptibility of the particular gas used for pressurization. Accordingly, the apparatus of FIG. 3 monitors the operating frequency f and if it deviates by a predetermined amount, the pressure within the enclosure is varied to change the frequency back to its normally operating value.

To accomplish this stabilization the apparatus includes a control circuit 70 operable to receive an indication of the frequency, f, on line 72 from the microwave circuitry 42 and compare it with a predetermined desired value. Any deviation greater than a set threshold will operate the valving arrangement to change the pressure. An indication of the pressure P within the enclosure 36 is provided to control circuit 70 via line 74. Control circuit 70 then functions to either increase the pressure by opening valves 56 and 58, with valve 64 closed, or reduce the pressure by closing valve 56, opening valves 58 and 64 and activating pump 66, until the desired frequency is attained.

The particular gas provided by gas source 50 must remain in its gaseous state in the presence of the cryogenic temperatures encountered since the presence of a liquid in the dielectric resonator enclosure would lead to a large change in frequency and a decrease in Q. Thus for a liquid nitrogen cooling arrangement, the cryogenic temperature established in the enclosure 36 is around 77K. A gas such as nitrogen at below atmospheric pressure, helium, hydrogen or neon, by way of example, should then be used, all of which liquefy at lower temperatures.

In actual tests, a dielectric resonator having a cylindrical sapphire dielectric member, as in FIG. 1 was operated at X-band in the $TE_{01\delta}$ mode, at the cryogenic temperature of around 77K. With a helium source of gas 50, the dielectric resonator exhibited a negative 0.6 MHz change in frequency with a positive one atmosphere change in pressure (and vice versa). With a nitrogen source of gas (operated at pressures below one atmosphere) the relationship was −0.9 MHz/atm.

Figure 4:
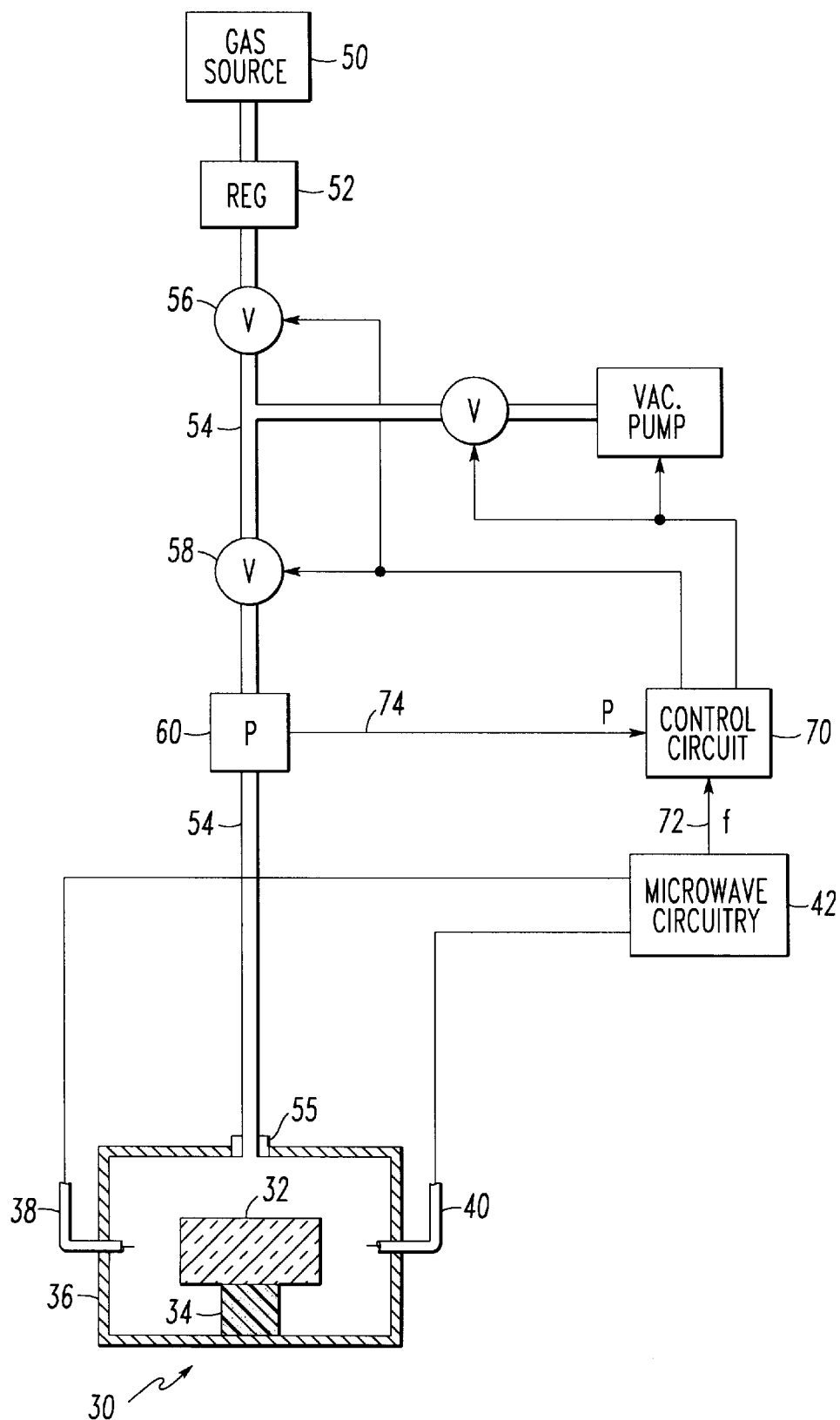
FIG. 4 illustrates another embodiment of the present invention.

Although operation at cryogenic temperatures provides for more precise frequency control, the apparatus may be operated at room temperature where less precise frequency control can be tolerated. Thus in FIG. 4, the same apparatus having like or corresponding parts denoted by like or corresponding reference numerals as already described in FIG. 3 is reproduced, however, without the cryogenic cooling arrangement.

Although the present invention has been described with a certain degree of particularity, it is to be understood that various substitutions and modifications may be made without departing from the spirit and scope of the invention as defined in the appended claims.

What is claimed is:

1. Dielectric resonator apparatus, comprising:
   A) a dielectric resonator having a normal operating frequency and including i) a sealed pressure enclosure, ii) a dielectric member within said enclosure, iii) first coupling means for coupling microwave power to said resonator, and iv) second coupling means for extracting microwave power from said resonator, said first and second coupling means being connectable with a microwave circuit;
   B) means for monitoring and obtaining an indication of the current operating frequency of said resonator and which current operating frequency may be different from said normal operating frequency;
   C) a control circuit;
   D) means for providing said control circuit with said indication of said current operating frequency of said resonator;
   E) a source of pressurized gas, having an output pressure, controllably connected to said enclosure;
   F) regulator means for regulating the output pressure of said source of pressurized gas;
   G) a gas conduit connecting said regulator means with an interior of said enclosure to supply said gas to said interior of said enclosure through said gas conduit;
   H) first and second valves for controlling the supply of gas in said conduit;
   I) a vacuum pump connected to said conduit to remove said gas from said enclosure;
   J) a third valve connected between said conduit and said vacuum pump;
   K) means for providing said control circuit with an indication of the pressure within said enclosure;
   L) said control circuit being operable to control the opening and closing of sa first, second and third valves in response to said current operating frequency and the pressure indication, to vary the pressure within said enclosure if said current operating frequency deviates by a predetermined amount from said normal operating frequency.

2. Apparatus according to claim 1 wherein:
   A) said dielectric member is a sapphire disk.

3. Apparatus according to claim 1 which includes:
   A) cryogenic cooling means;
   B) said enclosure being contained within said cryogenic cooling means.

4. Apparatus according to claim 3 wherein:
   A) said gas from said source is a gas which remains gaseous at a temperature established by said cryogenic cooling means.

5. Apparatus according to claim 3 wherein:
   A) said cryogenic cooling means establishes a temperature of around 77K.

6. Apparatus according to claim 5 wherein:
   A) said cryogenic cooling means is a liquified gas within a container.

7. Apparatus according to claim 6 wherein:
   A) said liquified gas is liquid nitrogen.

8. Apparatus according to claim 5 wherein:
   A) said gas from said source is selected from the group consisting of nitrogen at below atmospheric pressure, helium, hydrogen and neon.

* * * * *